United States Patent
Kertis et al.

(10) Patent No.: US 6,650,194 B1
(45) Date of Patent: Nov. 18, 2003

(54) PHASE SHIFT CONTROL FOR VOLTAGE CONTROLLED OSCILLATOR

(75) Inventors: Robert Andrew Kertis, Rochester, MN (US); Peter John Windler, Fort Collins, CO (US)

(73) Assignee: International Business Machines Corporation, Armonk, NY (US)

(*) Notice: Subject to any disclaimer, the term of this patent is extended or adjusted under 35 U.S.C. 154(b) by 6 days.

(21) Appl. No.: 09/696,514

(22) Filed: Oct. 25, 2000

(51) Int. Cl.[7] .................................................. H03B 5/00
(52) U.S. Cl. ..................... 331/117 R; 331/167; 331/57; 331/36 C
(58) Field of Search ........................... 331/36 C, 177 V, 331/135, 117 R, 179, 57, 167

(56) References Cited

U.S. PATENT DOCUMENTS 3,538,450 A  * 11/1970 Andrea et al.
6,211,745 B1 * 4/2001 Mucke et al. ........... 331/117 R
6,292,065 B1 * 9/2001 Friedman et al. ....... 331/117 R

OTHER PUBLICATIONS

Mourant, Jean–Marc et al., "A Low Phase Noise Monolithic VCO in SiGe BiCMOS", 2000 IEEE Radio Frequency Integrated Circuits Symposium, pp. 63–68.

* cited by examiner

Primary Examiner—Arnold Kinkead
(74) Attorney, Agent, or Firm—Karuna Ojanen

(57) ABSTRACT

A circuit is disclosed which adjusts the phase of a signal within an LC sinusoidal or a ring or other capacitive oscillator. The circuit uses FETs as capacitors. The gates of the FETs are connected to the capacitive node of the oscillator. The variable voltage source changes the state of the FET from depleted to inverted mode or from inverted to depleted mode which in turn dramatically changes the capacitance of the FET. The change of state exists for only a few clock cycles, typically less than five cycles, so that only the capacitance within the oscillator is instantaneously affected which changes adds as incremental/decremental frequency to adjust only the phase of the oscillation frequency. In this fashion, the average oscillation frequency not affected.

8 Claims, 4 Drawing Sheets

PHASE SHIFT CONTROL FOR VOLTAGE CONTROLLED OSCILLATOR

FIELD OF THE INVENTION

The present invention relates generally to the field of voltage controlled oscillators, and more particularly, the invention is directed to an apparatus and a method for controlling the phase shift of a voltage controlled oscillator independent of changing the oscillation frequency.

BACKGROUND OF THE INVENTION

A voltage controlled oscillator (VCO) is simply a circuit that generates an oscillating signal at a frequency proportional to an externally supplied voltage. VCOs are basic building blocks of many electronic systems especially phase-locked loops and may be found in computer disk drives, wireless electronic equipment such as cellular telephones, and other systems in which oscillation frequency is controlled by an applied tuning voltage. There are three basic designs for VCOs: an inductor/capacitor (LC) oscillator; a ring oscillator; and a relaxation or multivibrator oscillator.

In computer disk drive applications, ring oscillators have been used. Ring oscillators use voltage-controlled variable delay cells connected into a ring. The circuit oscillates at a frequency equal to the voltage controlled cell delay multiplied by twice the number of delay stages. Although high frequencies can be obtained with ring oscillators, they are susceptible to noise and jitter.

The multivibrator or relaxation oscillator oscillates by continuously charging and discharging a capacitor between two voltage levels using a voltage-controlled current source that supplies the current for charging and discharging the capacitor. These multivibrators are relatively simple, require few devices, and are capable of high speeds up to 7.4 GHz. The oscillation frequency, however, is partially dependent upon the capacitor value and is rather sensitive to thermal effects. Because of the sensitivity of the ring oscillators to noise and jitter and because of the sensitivity of the multivibrator or relaxation oscillator to thermal effects, experts in the industry use an oscillator based on inductors and capacitors, the LC oscillator, which is less susceptible to noise and jitter than the previously mentioned oscillator types.

One type of LC oscillator uses a field effect transistor (FET) as a varactor, i.e., a variable capacitance device, by electrically connecting the source and drain to provide a first terminal and the gate of the transistor then provides the other terminal. The capacitance of the modified FET varies significantly with the applied voltage. The capacitance is not only a function of the thickness of the gate oxide of the FET but also its size and whether the FET is in the depleted mode or is in the inverted mode. Transitioning the variable FET capacitor between inverted and depleted mode can yield a capacitance ratio of four or five to one. The capacitance and subsequently the frequency can be finely tuned by varying the voltage difference between the source/drain and the gate of the FET. Pairs of binary weighted FETs may be connected in parallel with a fixed capacitor to yield a voltage controlled tuning circuit. The effective capacitance of selected pairs of FETs can be varied and even switched into or out of a desired capacitive state to yield broadband performance. For example, by the inclusion of four such pairs, a four bit input provides a selection of up to sixteen different bands. Thus, the voltage controlled oscillator circuit having the FETs arranged as above into variable capacitive pairs may be switched in and out of different frequencies exhibiting operational characteristics that are relatively immune to parasitic effects.

Such a voltage controlled oscillator is particularly described in Mourant et al., "A Low Phase Noise Monolithic VCO in SiGe BiCMOS" *IEEE Radio Frequency Integrated Circuits Symposium* 65–68 (2000), also in U.S. patent application Ser. No. 09/483,368 filed Jan. 14, 2000, now abandoned, entitled "A Band-Switched Integrated Voltage Controlled Oscillator" by Mourant et al., which is commonly owned by the assignee herein and hereby incorporated by reference in its entirety. The voltage controlled oscillator of Mourant et al. takes advantage of the phenomena described above that a MOSFET becomes a variable capacitor when its source and drain are connected together. The gate to source/drain capacitance varies to a much greater degree with the applied voltage than the alternative reverse bias P/N diode resulting in a VCO circuit having a wide tuning range. Because switching into capacitive mode induced by the applied voltage is abrupt, the modified FET circuit of Mourant et al. is ideal in digital switching circuits, particularly in high frequency operations such as cellular telephones and/or in certain computer disk drive circuits. For precise frequency applications, however, the use of the binary-weighted FETS can only get so close; there must be an analog capacitor provided by a pair of diodes.

With respect to FIG. 1, a conventional phase-locked loop (PLL) 10 is shown. The PLL comprises conventional elements such as a charge pump 20 and a loop filter 22. Loop filter 22 comprises the capacitor 24 and a resistor 26 in series with the capacitor 24 to achieve rapid lock-in of the appropriate frequency. The voltage across the loop filter 22 is provided to a varactor driver 28 which provides a voltage to the oscillator 30 to generate a signal having a frequency proportional to the input voltage from the driver 28. The frequency is prescaled 32 to become a clock signal 34 of a selected frequency which is input to the timing detector 36. The data 38 is also input to the timing detector 36 which detects the difference, if any, between the frequency and the phase of the data 38 and the clock 34. If there is a difference between the frequencies and/or phase of the signals, then a timing correction signal 40 is fedback to the charge pump 20 to adjust the charge on the capacitor 24 which in turn adjusts the clock frequency 34 by another iteration of the process described above. There is, its however, a charge-up time of the timing loop capacitor 24 so that after its capacitor 24 charges, the clock frequency 34 changes slightly.

In disk drive and other applications where data and the oscillator are at or very near the same frequencies there is little or no need to adjust the frequencies by multiple iterations as above. There is, however, a need in the industry to align the phase of the clock with the data without changing the frequency in an LC oscillator.

SUMMARY OF THE INVENTION

These needs and other are met by an embodiment of the present invention, herein disclosed as an LC sinusoidal oscillator comprising an inductive element connected to a supply voltage and a capacitive element connected to an applied voltage which generate an oscillation frequency proportional to the applied voltage, and a negative resistance structure connected to the inductive element and capacitive element; the capacitive element further comprises a fixed capacitor circuit, an incremental capacitive element and a decremental capacitive element connected in parallel to the fixed capacitor circuit. The incremental capacitive element may further comprise at least one field effect transistor whose gate is electrically connected to the capacitive element and whose source and drain are electrically connected to an incremental voltage source to change the state of the at least one field effect transistor to a depleted mode thereby decreasing the capacitance of the capacitive element and providing an instantaneous incremental frequency for phase alignment of the oscillation frequency. The decremental capacitive element may further comprise at least one field effect transistor whose gate is electrically connected to the capacitive element and whose source and drain are electrically connected to a decremental voltage source to change the state of the at least one field effect transistor to an inverted mode thereby increasing the capacitance on capacitive element and providing an instantaneous decremental frequency for phase alignment of the oscillation frequency.

The decremental and the incremental capacitive elements may be combined into the same LC oscillator circuit.

The invention may further be considered a phase correction circuit for an oscillator circuit having a capacitive element, the phase correction circuit comprising: an incremental capacitive element and a decremental capacitive element connected directly to the capacitive element of the oscillator circuit; wherein the phase correction circuit operates independently of any oscillation frequency correction of the oscillator circuit. The phase correction circuit may further comprise a band-switched integrated voltage controlled oscillator with an inductive element connected to the capacitive element. In an alternative embodiment, the phase correction circuit may further comprise a ring oscillator. In any event, the incremental capacitive element of the phase correction circuit may comprise at least one FET whose source and drain are electrically connected together and to an incremental voltage source, and whose gate is connected to the capacitive element wherein when an incremental voltage is applied for a sufficient time to allow the at least one FET to transition to a depleted mode, the capacitance of the capacitive element decreases for phase alignment of the oscillation frequency to an externally applied frequency. In a differential oscillator embodiment, the at least one FET further comprises two FETs whose source/drain are connected to the incremental voltage source. Similarly, the decremental capacitive element of the phase correction circuit may comprise at least one FET whose source and drain are electrically connected together and connected further to a decremental voltage source, and whose gate is connected to the capacitive node wherein when an decremental voltage is applied for a sufficient time to allow the at least one FET to transition to an inverted mode, the capacitance of the capacitive node increases for phase alignment of the oscillation frequency to an externally applied frequency. Likewise, in a differential voltage oscillator embodiment, the at least one FET further comprises two FETs whose source/drain are connected to the decremental voltage source.

The invention may further be considered a phase correction circuit connected to an oscillator, the oscillator comprising a fixed capacitive element and the phase correction circuit comprising at least one FET whose source and drain are electrically connected together, the at least one FET further connected to an incremental/decremental voltage source wherein an incremental/decremental voltage is applied for a sufficient time to allow the at least one FET to transition from either a depleted to an inverted mode or from an inverted to a depleted mode thereby providing an instantaneous incremental/decremental phase adjustment of the oscillator frequency.

The invention may yet still be considered a first circuit to vary the capacitance within a second circuit, comprising: a first FET capacitor network having a first and second FET connected to a first voltage, a second FET capacitor network having a third and fourth FET connected to a second voltage; the gates of the first and third FETs being connected to a capacitive node of the second circuit, the gates of the second and fourth FETs being connected to the capacitive node of the second circuit, the source/drain of the first FET tied to the source/drain of the second FET and to the first voltage, and the source drain of the third FET tied to the source/drain of the fourth FET and to the second voltage; whereupon when the first or the second voltage changes, the capacitance of the second circuit changes.

The recitation herein of a list of inventive features which are met by various embodiments of the present invention is not meant to imply or suggest that any or all of these features are present as essential or necessary features, either individually or collectively, in the most general embodiment of the present invention or in any of its more specific embodiments.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
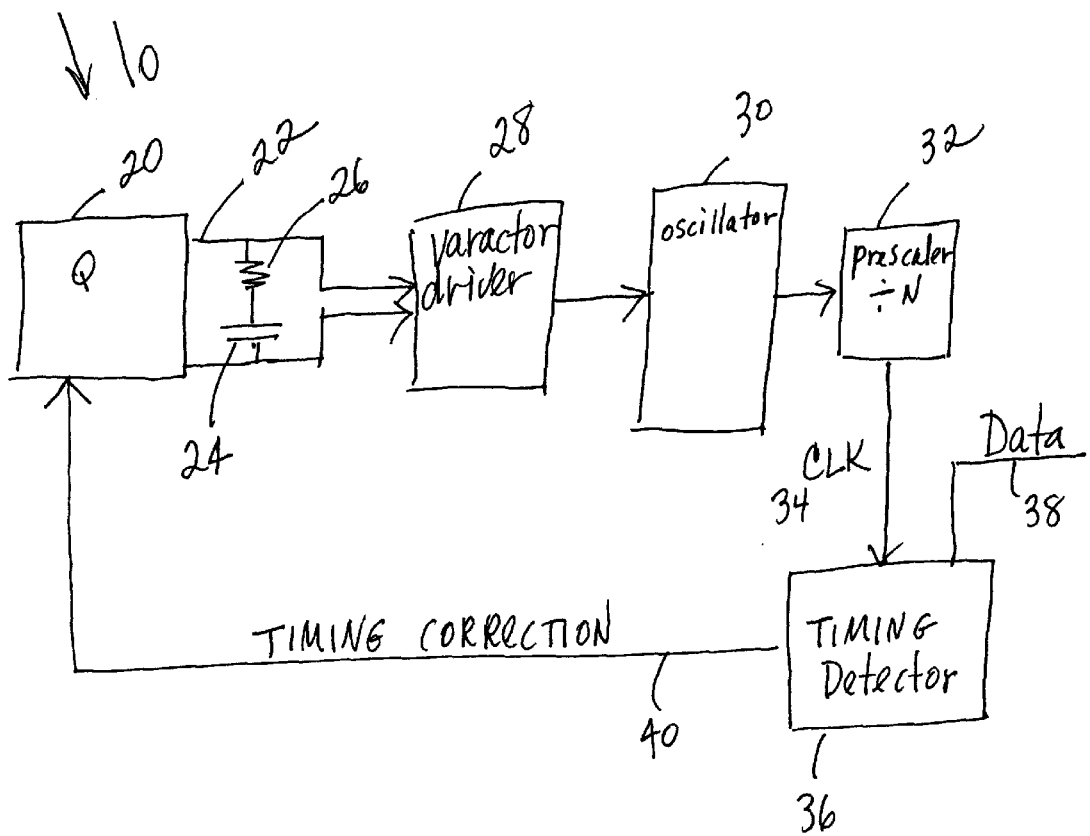
FIG. 1 is a simplified block diagram of a prior art PLL.
Figure 2:
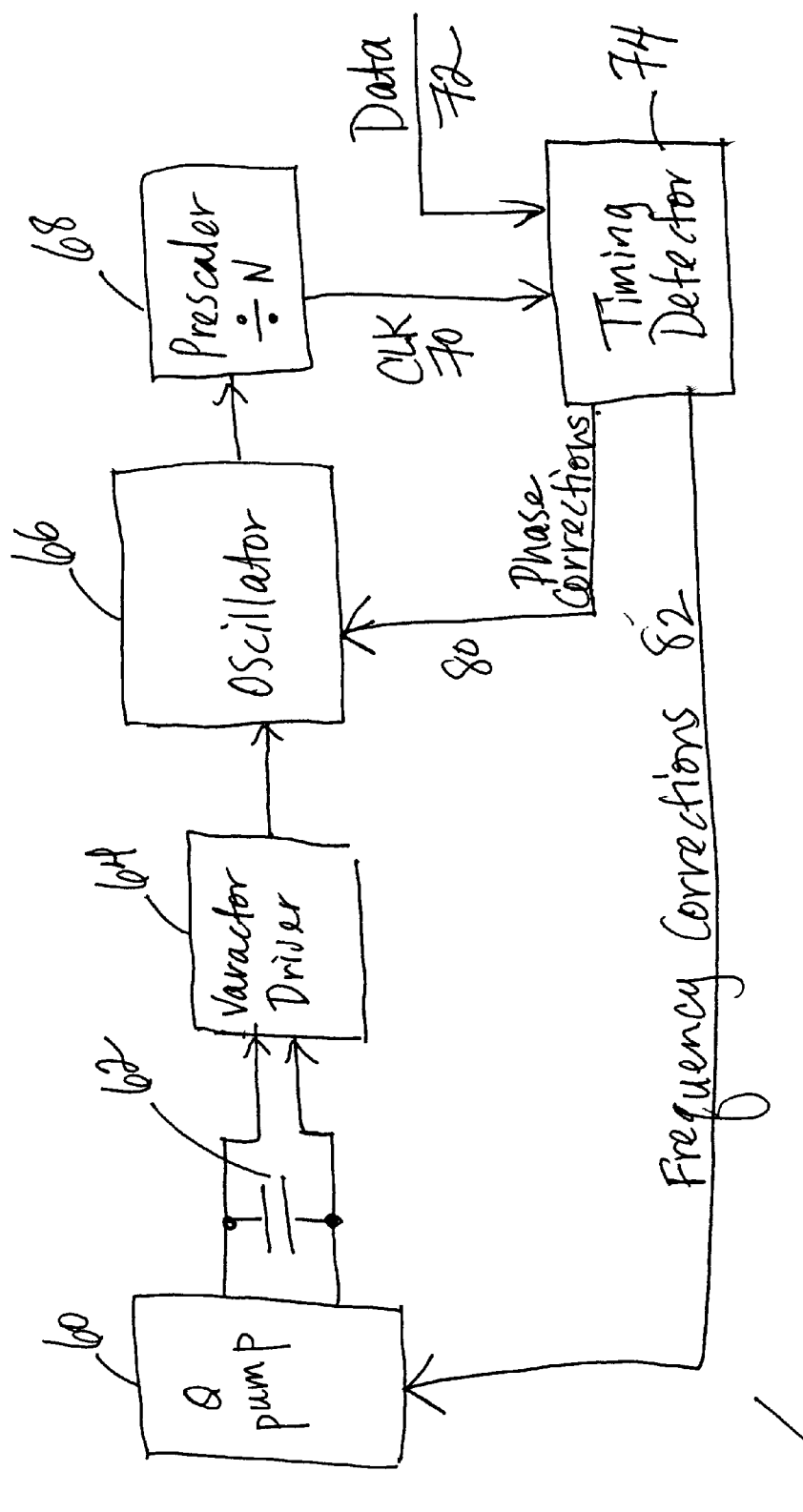
FIG. 2 is a simplified block diagram of a PLL having phase correction independent of frequency correction in accordance with principles of the invention.

With reference to FIG. 2, there is shown a PLL circuit 50 incorporating an embodiment of phase correction in accordance with principles of the invention. The charge pump 60 provides a current to the loop filter capacitor 62 which then charges/discharges the voltage on it. Voltage is provided to the varactor driver 64 which outputs a voltage to the oscillator circuit 66. The oscillator circuit 66 may be as described by Mourant et al. as incorporated by reference or it may be a ring oscillator or other LC sinusoidal oscillator. As before, the output of the oscillator circuit 66 whose frequency is proportional to the input voltage is prescaled 68 to achieve the desired clock frequency 70. This clock frequency 70 determined by the loop filter capacitor 62 is referred to as the oscillation or operating frequency. There is a timing detector 74 whose inputs are the clock frequency 70 and the data 72 to compare the frequency and the phase of the data 72 and the clock 70. Rather than only correcting the frequency as in the prior art PLL 10 above, the invention provides an independent path for correction of the phase 80 which provides feedback directly to the oscillator circuit 66. There is no effect on the loop filter capacitor 62 with these independent phase corrections.

Figure 3:
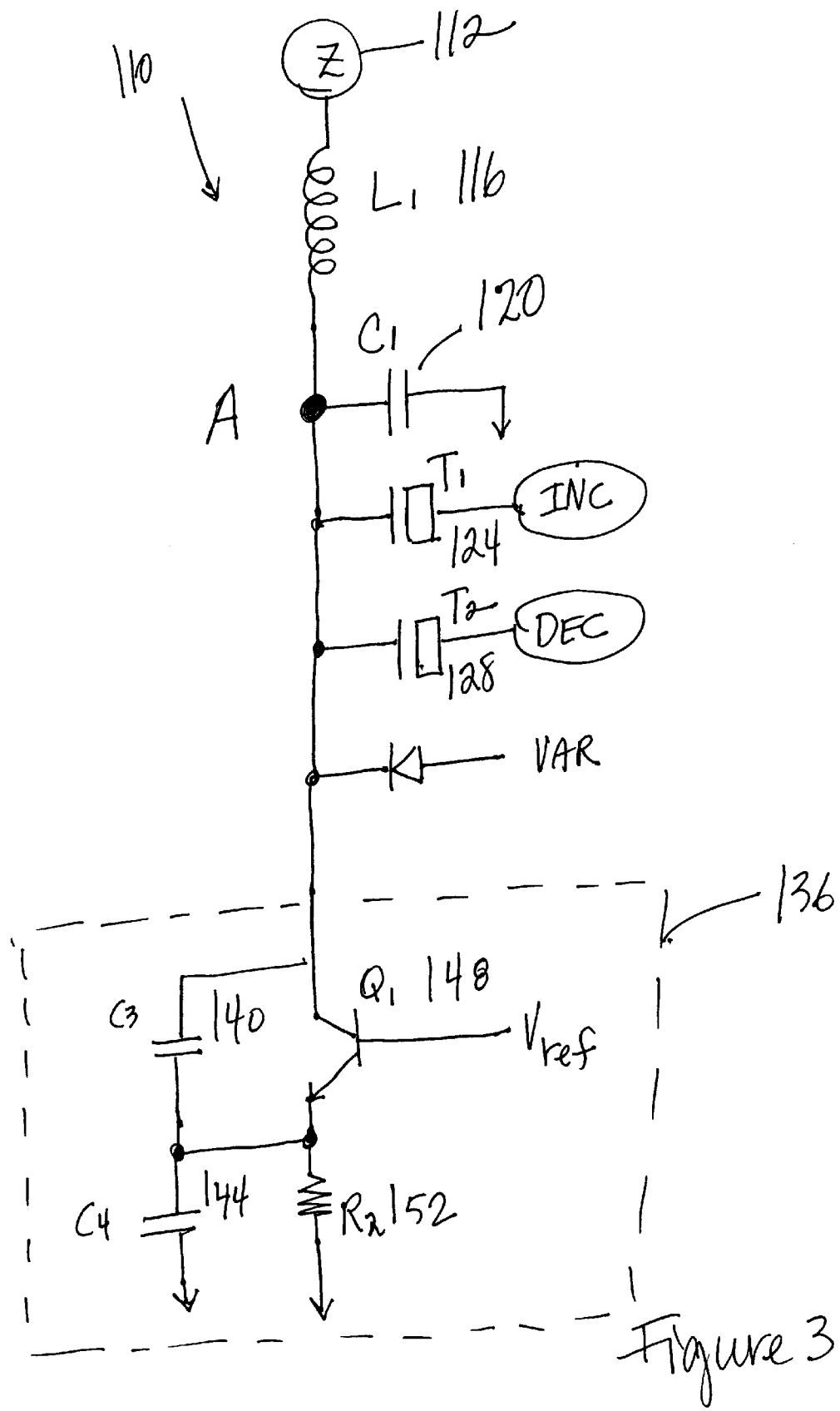
FIG. 3 is a schematic circuit diagram illustrating a single-ended LC voltage controlled oscillator utilizing a phase correction circuit in accordance with an embodiment of the invention.

With reference to FIG. 3 therein is one embodiment of the invention which incorporates FETs in a LC voltage controlled oscillator for independent phase correction. A single-ended voltage controlled oscillator 110 would be positioned in the oscillator circuit 66 of FIG. 2. The voltage controlled oscillator 110 in FIG. 3 is of LC sinusoidal oscillator type but other voltage controlled oscillators, such as ring oscillators may be used with the phase shift circuit as described herein. From a voltage source 112 an inductor L1 116 is connected to a first capacitor 120 having a fixed capacitance which is further connected to an AC ground. In integrated semiconductor applications, this voltage source is on the order of 1.8 volts or 1.5 volts but may be greater or less depending upon the application which is not limited to integrated semiconductor applications. The oscillation frequency is determined by charging and discharging capacitor C1 120 using the inductor L1 116 and as with all LC systems, the frequency of oscillation is proportional to the $1/\sqrt{(LC)}$. Connected to the first capacitor C1 120 are two FETs T1 124 and T2 128. FET T1 causes an incremental frequency, fraction of a percent of the oscillation frequency, for one or two cycles whereas FET T2 128 causes a small decremental frequency, also a fraction of a percent of the oscillation frequency, for several cycles to provide phase corrections. This incremental/decremental frequency results from changing the sum of all the capacitances connected across node A. A negative resistance circuit 136, one of which is shown as comprising two series capacitors C3 140 and C4 144 in parallel with a transistor Q1 148 and a resistor R2 152, is added in parallel to the inductor and capacitor to sustain the oscillation. The emitter of transistor Q1 148 is connected between the two capacitors C3 140 and C4 144.

Figure 4:
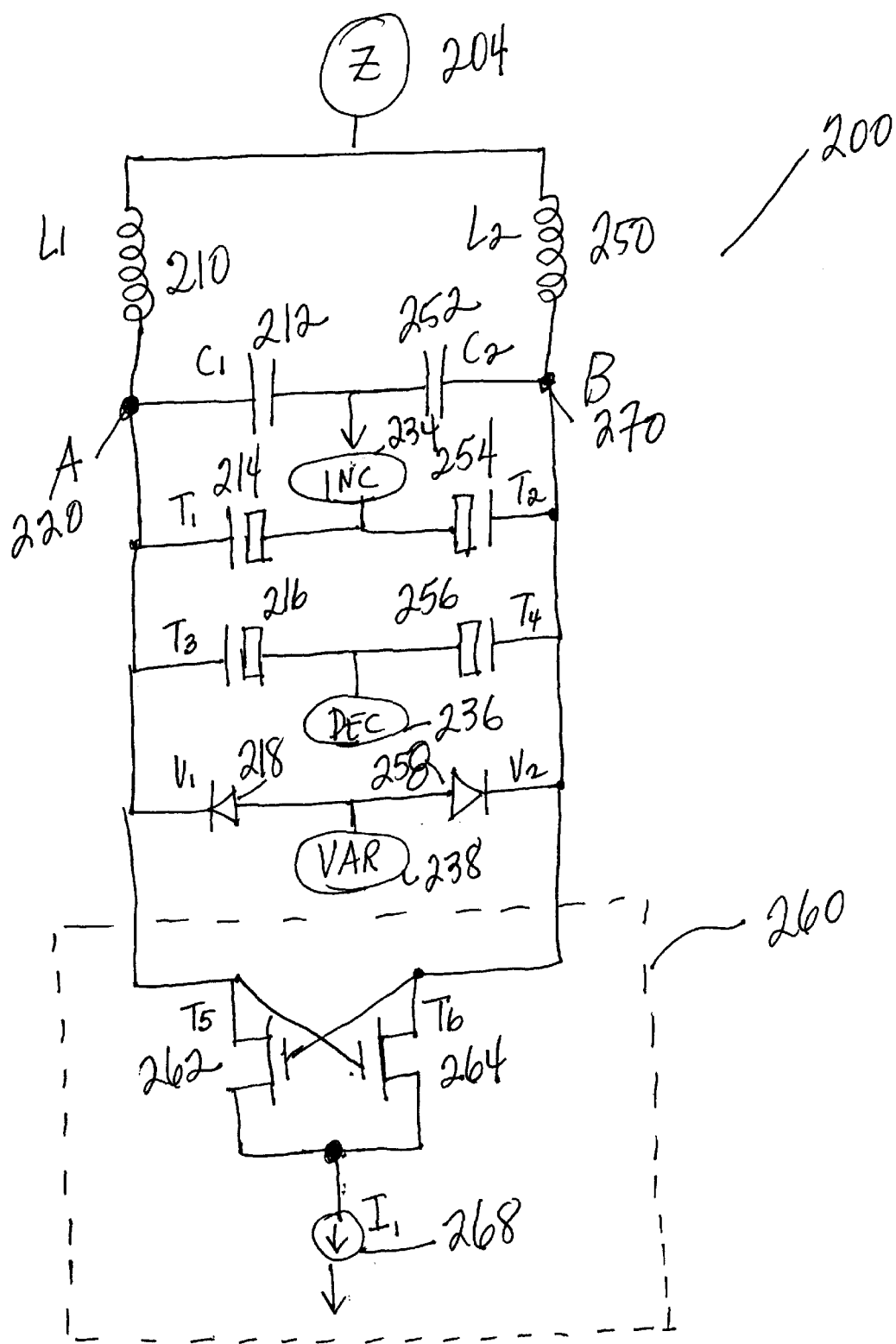
FIG. 4 is a schematic circuit diagram illustrating a differential voltage LC controlled oscillator incorporating the phase correction circuit in accordance with an embodiment of the invention. It is suggested that FIG. 4 be printed on the face of the patent.

A differential voltage controlled oscillator 200 in accordance with principles of the invention is shown in FIG. 4. The voltage controlled oscillator 200 of FIG. 4 is similar to that of U.S. patent application Ser. No. 09/483,368, now abandoned, filed Jan. 14, 2000 entitled "A Band-Switched Integrated Voltage Controlled Oscillator" by Mourant et al., but has been modified to incorporate the independent phase correction features of the invention. It will be acknowledged by one skilled in the art that other voltage controlled oscillators, such as ring oscillators, can also take advantage of features of the invention. Connected in parallel to a voltage source 204 are inductors L1 210 and L2 250 with the oscillation frequency determined by the resonant frequency of inductor L1 210 and inductor L2 250 and a stage of fixed capacitance of capacitors C1 212 and C2 252. Rather than a single stage of fixed capacitance, the bandwidth of the oscillator can be tuned by easily replacing capacitors C1 212 and C2 252 with one or more stages of FET devices of the Mourant application Ser. No. 09/483,368, now abandoned, referenced above. In the LC voltage controlled oscillator of that application, four capacitance stages, each a pair of capacitive elements connected in series to a resistor provide digital bandwidth control of the voltage controlled oscillator. By applying variable voltages levels, effective capacitance may be added to the resonant circuit of fixed capacitance capacitors C1 212 and C2 252 to define the upper and lower capacitive limits for an LC resonant circuit. Variable voltage 238 is applied to the junction of diodes V1 218 and V2 258 which could also have been FET analog varactors as well. The capacitance, whether in single or multiple stages, to determine the oscillation frequency is referred to as fixed capacitance because during operation, this oscillation frequency does not change. The fixed capacitance is to be distinguished from the incremental/decremental capacitance provided by the independent phase correction feature of the invention.

Features of the invention which allow indenpendent fine phase tuning include two FET capacitor networks connected across the inductors L1 210 and L2 250, and in parallel with fixed capacitors C1 212 and C2 252 and, of course, any stages of fixed capacitive elements for bandwidth tuning. The first FET phase network comprises FET T1 214 and FET T2 254 connected to an incremental voltage source 234. The second FET phase network comprises FET T3 216 and FET T4 256 connected to a decremental voltage source 236. Point A 220 represents the voltage of the gates of T1 214 and T3 216 and point B 270 represents the voltage of the gates of T2 254 and T4 256; the source and drain of each transistor FET T1 214, FET T2 254, FET T3 216 and FET T4 256 are electrically connected so that the transistor functions as a capacitor. In a normal state, the voltage at node A 220 and node B 270 are electrically connected to voltage source Z 204 and are at the same common mode.

To speed up the frequency of the voltage controlled oscillator of FIG. 4, the incremental voltage source 234 provides sufficient voltage for the FETs T1 214 and T2 254 to go from inverted to depleted mode, i.e., from a high capacitance state to a low capacitance state for very few clock cycles, e.g., one or two clock cycles. The capacitance values of T1 214 and T2 254 decrease so that the total capacitance of the oscillator decreases and an incremental frequency is added to the oscillation frequency for several clock cycles for phase alignment. To decrement the frequency the voltage at 236 changes for a brief time to cause the FETs T3 216 and T4 256 to transition to an inverted state. Transistors T3 216 and T4 256 then change to a greater capacitance and the total capacitance of the system increases. Accordingly, the decremental frequency decreases the overall frequency for only a few cycles to enable appropriate phase alignment. The incremental/decremental frequency resulting from the change in capacitance is small enough in terms of both magnitude and temporal duration that it only adjusts the phase and does not affect the average operating oscillation frequency. Once the phase has been aligned by the instantaneous incremental/decremental frequency, the average oscillation frequency remains at its starting position.

A negative resistance circuit 260 is provided by cross coupling transistors T5 262 and T6 264 and current source I at 268. Other circuits providing a resistance to balance the inherent resistance of the oscillator 200 in order to sustain the oscillation can certainly be used. In preferred embodiments of the present invention inductors L0 210 and L1 250 are on the order of one nanohenry devices; capacitors C1 212 and C2 252 are on the order of one picofarad capacitors. While the invention has been described using n-type semiconductor technology, it may also be realized using p-type semiconductor technology. In addition, the phase correction circuit as described above may be implemented in CMOS or silicon-on-insulator (SOI); the inductors and other circuit elements may be fabricated from materials such as copper, gold, aluminum and other materials having low electrical resistance.

The invention as described is particularly useful in disk drive and other applications where the data on the disk or other signal of interest and the oscillator are at very near frequencies but the phases of the two signals may not be aligned. Clock frequency is not affected because the technique and apparatus herein modulates the capacitance connected to the input voltage of the oscillator itself, rather than changing the capacitance of the loop filter in a PLL which changes both the phase and the frequency.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An LC sinusoidal oscillator comprising;
  (a) an inductive element connected to a supply voltage;
  (b) a capacitive element connected to an applied voltage, the oscillator to generate an oscillation frequency proportional to the applied voltage, said capacitive element further comprising:
    (i) a fixed capacitor circuit to determine the oscillation frequency; and
    (ii) a phase correction circuit comprising:
      (1) an incremental capacitive element connected in parallel to the fixed capacitor circuit, the incremental capacitive element comprising at least one field effect transistor whose gate is electrically connected to the capacitive element and whose source and drain are electrically connected to an incremental voltage source to change the state of the at least one field effect transistor to a depleted mode thereby decreasing the capacitance of the capacitive element and providing an instantaneous incremental frequency for phase alignment of the oscillation frequency; and
      (2) a decremental capacitive element connected in parallel to the fixed capacitor circuit; and
  (c) a negative resistance structure connected to the inductive element and capacitive element.

2. The LC oscillator circuit of claim 1, wherein the decremental capacitive element of the phase correction circuit further comprises at least one field effect transistor whose gate is electrically connected to the capacitive element and whose source and drain are electrically connected to a decremental voltage source to change the state of the at least one field effect transistor to an inverted mode thereby increasing the capacitance on capacitive element and providing an instantaneous decremental frequency for phase alignment of the oscillation frequency.

3. A phase correction circuit for an oscillator circuit having a capacitive element, said phase correction circuit comprising:
  (a) a band-switched integrated voltage controlled ring oscillator with an inductive element connected to the capacitive element;
  (b) an incremental capacitive element connected directly to the capacitive element of the oscillator circuit;
  (c) a decremental capacitive element connected directly to the capacitive element of the oscillator;
wherein the phase correction circuit operates independently of any oscillation frequency correction of the oscillator circuit.

4. The phase correction circuit of claim 3, wherein the incremental capacitive element further comprises at least one FET whose source and drain are electrically connected together and connected further to an incremental voltage source, and whose gate is connected to the capacitive element wherein when an incremental voltage is applied for a sufficient time to allow the at least one FET to transition to a depleted mode, the capacitance of the capacitive element decreases for phase alignment of the oscillation frequency to an externally applied frequency.

5. The phase correction circuit of claim 4, wherein the at least one FET further comprises two FETs whose source/drain are connected to the incremental voltage source.

6. The phase correction circuit of claim 3, wherein the decremental capacitive element further comprises at least one FET whose source and drain are electrically connected together and connected further to a decremental voltage source, and whose gate is connected to the capacitive element wherein when a decremental voltage is applied for a sufficient time to allow the at least one FET to transition to an inverted mode, the capacitance of the capacitive element increases for phase alignment of the oscillation frequency to an externally applied frequency.

7. The phase correction circuit of claim 6, wherein the at least one FET further comprises two FETs whose source/drain are connected to the decremental voltage source.

8. A phase correction circuit connected to an oscillator, the oscillator comprising a fixed capacitive element to determine oscillation frequency, the phase correction circuit comprising at least one FET whose source and drain are electrically connected together, the at least one FET further connected to an incremental/decremental voltage source wherein an incremental/decremental voltage is applied for a sufficient time to allow the at least one FET to transition from either a depleted to an inverted mode or from an inverted to a depleted mode thereby providing an instantaneous incremental/decremental phase adjustment of the oscillator frequency.

\* \* \* \* \*